(12) United States Patent
Sasagawa et al.

(10) Patent No.: US 8,476,122 B2
(45) Date of Patent: Jul. 2, 2013

(54) ETCHING METHOD AND METHOD FOR MANUFACTURING SEMICONDUCTOR DEVICE

(75) Inventors: Shinya Sasagawa, Kanagawa (JP); Hiroshi Fujiki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 75 days.

(21) Appl. No.: 13/273,267

(22) Filed: Oct. 14, 2011

(65) Prior Publication Data
US 2012/0094445 A1  Apr. 19, 2012

(30) Foreign Application Priority Data
Oct. 15, 2010 (JP) ................................ 2010-232823

(51) Int. Cl.
*H01L 21/00* (2006.01)

(52) U.S. Cl.
USPC .................... 438/149; 438/734; 257/E21.372

(58) Field of Classification Search
USPC ................. 438/149, 706, 734; 257/E21.372, 257/E21.441
See application file for complete search history.

(56) References Cited

U.S. PATENT DOCUMENTS

| 7,071,037 | B2 | 7/2006 | Suzawa et al. | |
| 7,416,928 | B2 * | 8/2008 | Kakehata et al. | 438/166 |
| 7,998,801 | B2 | 8/2011 | Sasagawa et al. | |
| 2009/0061573 | A1 | 3/2009 | Miyairi et al. | |
| 2010/0062556 | A1 | 3/2010 | Sasagawa et al. | |
| 2011/0147745 | A1 | 6/2011 | Sasagawa et al. | |
| 2011/0147755 | A1 | 6/2011 | Miyairi et al. | |

FOREIGN PATENT DOCUMENTS

| JP | 05-267240 | 10/1993 |
| JP | 08-115899 | 5/1996 |
| JP | 09-092644 | 4/1997 |
| JP | 2001-217424 | 8/2001 |

* cited by examiner

*Primary Examiner* — Quoc Hoang
(74) *Attorney, Agent, or Firm* — Nixon Peabody LLP; Jeffrey L. Costellia

(57) ABSTRACT

A method for manufacturing a semiconductor device with high electric characteristics is provided. Part of a stacked semiconductor film in which an amorphous semiconductor film is provided on a crystalline semiconductor film is etched using a mixed gas including an HBr gas, a $CF_4$ gas, and an oxygen gas, so that part of the crystalline semiconductor film provided in the stacked semiconductor film is exposed. Etching for forming a back channel portion of a thin film transistor is performed with the method for etching, whereby high electric characteristics can be provided for the thin film transistor.

35 Claims, 7 Drawing Sheets

ETCHING METHOD AND METHOD FOR MANUFACTURING SEMICONDUCTOR DEVICE

BACKGROUND OF THE INVENTION

1. Field of the Invention

The present invention relates to a method for etching and a method for manufacturing a thin film element employing the method for etching. As the thin film element, a thin film transistor can be given, for example. Note that in this specification, any device including a thin film element in which a semiconductor layer is provided is referred to as a semiconductor device.

2. Description of the Related Art

In recent years, semiconductor devices have been necessary for our life. Thin film elements such as thin film transistors included in such semiconductor devices are manufactured by forming a thin film over a substrate and processing the thin film into a desired shape by etching or the like. Such a method for manufacturing a thin film element is applied to liquid crystal display devices (e.g., liquid crystal televisions), for example.

In thin film transistors of conventional liquid crystal televisions, amorphous silicon films are often used as semiconductor films. This is because structures of thin film transistors formed of amorphous silicon films are thought to be manufactured with relative ease.

However, when the current circumstances of moving images (e.g., watching movies and sports in 3D) is taken into account, sharpness of moving images in a liquid crystal television using amorphous silicon films is insufficient; therefore, thin film transistors having high carrier mobility which responds at high speed are under development. For this reason, microcrystalline silicon films have been developed. As a reference disclosing a thin film transistor using a microcrystalline silicon film, Patent Document 1 can be given, for example.

In Patent Document 1, a thin film transistor having a high field effect mobility and high on-state current is disclosed.

REFERENCE

[Patent Document 1] Japanese Published Patent Application No. 2001-217424
[Patent Document 2] Japanese Published Patent Application No. H5-267240

SUMMARY OF THE INVENTION

A thin film transistor disclosed in Patent Document 1 has a structure in which an amorphous silicon film is provided on a microcrystalline silicon film, the microcrystalline silicon film and the amorphous silicon film are formed of the same material, and part of the microcrystalline silicon film is exposed in a channel formation region of the thin film transistor. When such a structure is manufactured, the thickness of the microcrystalline silicon film in the exposed region is reduced or the amorphous silicon film is not sufficiently etched. This is because when a crystalline semiconductor film and an amorphous semiconductor film are formed of the same kind of material, it is difficult to make the etching rate of the crystalline semiconductor film significantly different from that of the amorphous semiconductor film (that is, to make the etching selectivity high). As etching of the crystalline semiconductor film and the amorphous semiconductor film, dry etching using a fluorine-based gas as a source gas and wet etching using hydrofluoric acid are exemplified in Patent Document 1. However, even in the case of the dry etching using a fluorine-based gas as a source gas, it is difficult to obtain sufficiently high etching selectivity between the microcrystalline silicon film and the amorphous silicon film. Therefore, it is difficult to provide high characteristics of a semiconductor device by such a dry etching using only a fluorine-based gas.

An object of one embodiment of the present invention is to provide a method for etching and a method for manufacturing a semiconductor device to provide high characteristics of the semiconductor device.

One embodiment of the present invention is a method for etching including the step of performing a first etching with the use of a $CF_4$ gas and a second etching with the use of a mixed gas including an HBr gas, a $CF_4$ gas, and an oxygen gas on part of a stacked semiconductor film in which an amorphous semiconductor film is provided on a crystalline semiconductor film to expose part of the crystalline semiconductor film provided in the stacked semiconductor film.

As a reference disclosing such a method for etching with the use of a mixed gas of an HBr gas, a gas including F, and an oxygen gas, Patent Document 2 can be given, for example. In Patent Document 2, a method for etching a tungsten silicide film in which the etching selectivity of the tungsten silicide film to a silicon oxide film is high is disclosed. According to Patent Document 2, etching of the tungsten silicide film is performed by reactive ion etching with the use of a mixed gas of $SF_6$, HBr, and $O_2$. That is, in the techniques disclosed in Patent Document 2, the method for etching is a method for etching when a silicon oxide film is a base film and a tungsten silicide film is an etched film, and the etching selectivity of these films is high. Consequently, the base film and the etched film in the method for etching of Patent Document 2 are different from a base film and an etched film in the method for etching of one embodiment of the present invention.

Further, one embodiment of the present invention is a method for manufacturing a semiconductor device employing the method for etching.

One embodiment of the present invention is a method for etching including the step of performing at least a first etching and a second etching on part of a stacked semiconductor film in which an amorphous semiconductor film is provided on a crystalline semiconductor film to expose part of the crystalline semiconductor film provided in the stacked semiconductor film. The first etching is performed with the use of a $CF_4$ gas and the second etching is performed with the use of a mixed gas including an HBr gas, a $CF_4$ gas, and an oxygen gas.

One embodiment of the present invention is a method for etching including the steps of forming an etching mask over a first region of a stacked semiconductor film in which an amorphous semiconductor film is provided on a crystalline semiconductor film, and performing at least a first etching and a second etching thereon to expose the crystalline semiconductor film in a second region. The first etching is performed with the use of a $CF_4$ gas and the second etching is performed with the use of a mixed gas including an HBr gas, a $CF_4$ gas, and an oxygen gas.

The second etching in the above structure may be performed with a bias power which is greater than 0 W and less than or equal to 100 W. In the second etching, the area of the smaller electrode of an upper and lower electrodes in an etching device is preferably more than or equal to 340 $cm^2$.

In the above structure, the flow ratio of the HBr gas, the $CF_4$ gas, and the oxygen gas in the second etching is preferably 24:1:1.

In the above structure, as the crystalline semiconductor film, a microcrystalline semiconductor film may be used.

In the above structure, for the microcrystalline semiconductor film, microcrystalline silicon may be used, and for the amorphous semiconductor film, amorphous silicon may be used.

The method for etching in the above structure of one embodiment of the present invention can be applied to a method for manufacturing a semiconductor device.

Note that in this specification, a pixel transistor is exemplified as a transistor when a semiconductor device is described. However, the transistor is not limited thereto and a semiconductor device of one embodiment of the present invention may include a transistor other than a pixel transistor.

According to a method for etching of one embodiment of the present invention, high etching selectivity of an amorphous semiconductor film to a crystalline semiconductor film can be obtained.

According to a method for manufacturing a semiconductor device of one embodiment of the present invention, even in the case where an amorphous semiconductor film is provided on a crystalline semiconductor film and part of the crystalline semiconductor film is exposed by etching part of the amorphous semiconductor film, a semiconductor device with high electric characteristics can be manufactured. In other words, a semiconductor device with a small subthreshold swing value (S value), a low threshold voltage, and low off-state current can be provided.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description of the embodiments below.

Embodiment 1

In this embodiment, a method for manufacturing a semiconductor device of one embodiment of the present invention will be described with reference to FIGS. 1A to 1D and FIGS. 2A to 2D.

Figure 1A:
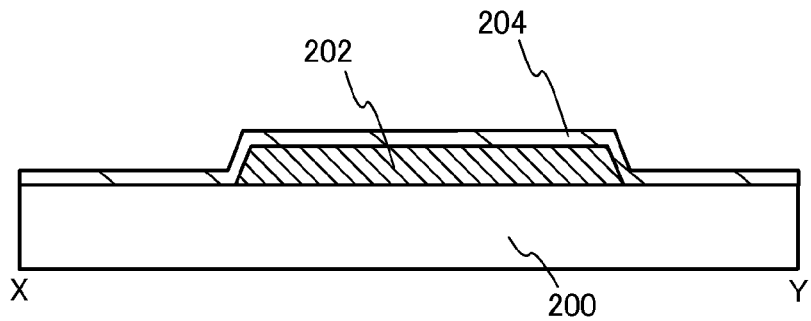
FIGS. 1A to 1D illustrate a method for manufacturing a semiconductor device of one embodiment of the present invention.

First, a first conductive layer 202 is formed over a substrate 200, and a first insulating layer 204 is formed so as to cover the first conductive layer 202 (FIG. 1A).

The substrate 200 is an insulating substrate. As the substrate 200, as well as a glass substrate, a quartz substrate, and a ceramic substrate, a plastic substrate or the like with heat resistance that is high enough to withstand a process temperature in this manufacturing process can be used, for example. In the case where the substrate 200 is a glass substrate, any of the substrate of the first generation (e.g., 320 mm×400 mm) to the tenth generation (e.g., 2950 mm×3400 mm) can be used; however, the substrate is not limited thereto. Note that reduction in the film thickness of a semiconductor layer which serves as a channel formation region within a substrate surface can be suppressed by employing the method for etching of one embodiment of the present invention; thus, variation of the film thickness of the semiconductor layer within the substrate surface can be suppressed. The effect of the present invention is notable particularly in the case where a large-sized substrate of the eighth generation or later is used.

The first conductive layer 202 may be formed in such a manner that a conductive film (e.g., a metal film or a semiconductor film to which an impurity element imparting one conductivity type is added) is formed by a sputtering method, an etching mask is formed over the conductive film, and selective etching is performed thereon. Alternatively, an inkjet method may be used. Note that the conductive film which serves as the first conductive layer 202 may be formed to have either a single-layer structure or a layered structure including a plurality of layers. For example, the conductive film may be formed to have a three-layer structure in which an Al layer is sandwiched between Ti layers. Note that the first conductive layer 202 forms at least a scan line and a gate electrode.

As the first insulating layer 204, for example, a film may be formed using an insulating material (e.g., silicon nitride, silicon nitride oxide, silicon oxynitride, or silicon oxide) by a plasma CVD method. Note that the first insulating layer 204 may be formed to have either a single-layer structure or a layered structure including a plurality of layers. A two-layer structure in which a silicon oxynitride layer is stacked over a silicon nitride layer is employed here, for example. The first insulating layer 204 forms at least a gate insulating layer.

The substance "silicon nitride oxide" includes more nitrogen than oxygen in composition, and preferably includes oxygen, nitrogen, silicon, and hydrogen at concentrations ranging from 5 at. % to 30 at. %, 20 at. % to 55 at. %, 25 at. % to 35 at. %, and 10 at. % to 30 at. % respectively according to the measurements using Rutherford backscattering spectrometry (RBS) and hydrogen forward scattering (HFS).

The substance "silicon oxynitride" includes more oxygen than nitrogen in composition, and preferably includes oxygen, nitrogen, silicon, and hydrogen at 50 at. % to 70 at. %, 0.5 at. % to 15 at. %, 25 at. % to 35 at. %, and 0.1 at. % to 10 at. % respectively according to the measurements using RBS and HFS.

Note that percentages of nitrogen, oxygen, silicon, and hydrogen fall within the ranges given above, where the total number of atoms included in the silicon oxynitride or the silicon nitride oxide is defined as 100 at. %.

Figure 1B:
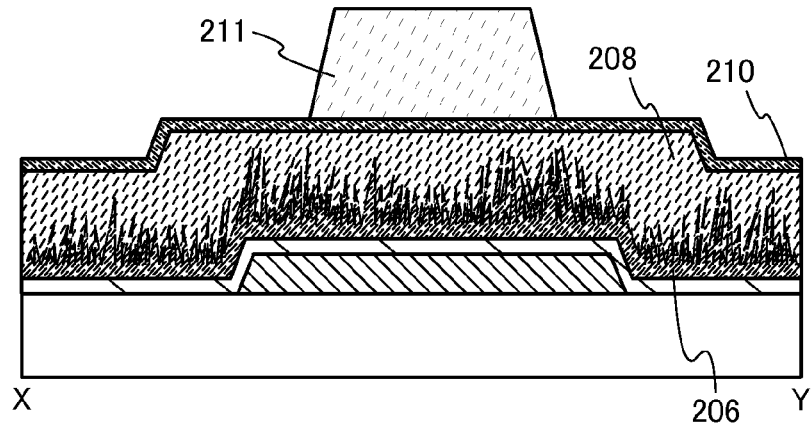

Next, a first semiconductor film 206, a second semiconductor film 208, and an impurity semiconductor film 210 are formed over the first insulating layer 204 (FIG. 1B).

The first semiconductor film 206 is a semiconductor film most part of which is crystalline. As a crystalline semiconductor, a microcrystalline semiconductor can be given, for example. Here, a microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of greater than or equal to 2 nm and less than or equal to 200 nm, preferably greater than or equal to 10 nm and less than or equal to 80 nm, more preferably more than or equal to 20 nm and less than or equal to 50 nm have grown in a direction of the normal to the substrate surface. Thus, crystal grain boundaries are formed at the interface of the columnar or needle-like crystal grains in some cases. Note that the diameter of the grain here means a maximum diameter of a crystal grain in a plane parallel to the substrate surface. Further, the crystal grain includes an amorphous semiconductor region and a crystallite which is a minute crystal that can be regarded as a single crystal. The crystal grain includes a twin crystal in some cases.

Microcrystalline silicon may be used as the microcrystalline semiconductor. Microcrystalline silicon, which is one of microcrystalline semiconductors, has a peak of a Raman spectrum which is shifted to a lower wave number side than 520 $cm^{-1}$ that represents single crystal silicon. That is, the peak of a Raman spectrum of microcrystalline silicon is within the range from 520 $cm^{-1}$ which represents single crystal silicon to 480 $cm^{-1}$ which represents amorphous silicon. In addition, the microcrystalline includes hydrogen or halogen at least 1 at. % in order to terminate a dangling bond. Moreover, a rare gas element such as He, Ar, Kr, or Ne may be included in the microcrystalline silicon to further promote lattice distortion, so that the stability is increased and a favorable microcrystalline semiconductor can be obtained.

The crystallinity can be improved when the concentration of oxygen and nitrogen (a value measured by a secondary ion mass spectrometry method) included in a crystalline semiconductor film is lowered, preferably to lower than $1 \times 10^{18}$ $cm^{-3}$.

Note that it is preferable to form a crystalline semiconductor film through a two-step film formation process. For example, in the two-step film formation process, a microcrystalline silicon film with a thickness of about 5 nm may be formed under a pressure of about 500 Pa at the first stage and a microcrystalline silicon film with a desired thickness may be formed under a pressure of about 5000 Pa at the second stage. The flow rate of silane at the second stage may be smaller than that at the first stage so that a high-dilution condition is set.

The second semiconductor film 208 is a semiconductor film most part of which is amorphous and serves as a buffer layer. The second semiconductor film 208 is preferably a semiconductor film including an amorphous semiconductor and a minute semiconductor crystal grain, having lower energy at the Urbach edge, which is measured by a constant photocurrent method (CPM) or photoluminescence spectrometry, and having a smaller quantity of absorption spectra of defects, as compared to a conventional amorphous semiconductor film. As compared to the conventional amorphous semiconductor film, such a semiconductor film is a well-ordered semiconductor film which has few defects and a steep tail slope of a level at a band edge (a mobility edge) in the valence band.

The second semiconductor film 208 may include halogen and/or nitrogen. When nitrogen is included, nitrogen may be included as an NH group or an $NH_2$ group.

Note that here, an interface region between the first semiconductor film 206 and the second semiconductor film 208 has microcrystalline semiconductor regions and an amorphous semiconductor region filling the space between the microcrystalline semiconductor regions. Specifically, the interface region between the first semiconductor film 206 and the second semiconductor film 208 includes a microcrystalline semiconductor region which extends in a conical or pyramidal shape from the first semiconductor film 206 and "a film including an amorphous semiconductor" which is similar to the second semiconductor film 208.

A buffer layer is formed using the second semiconductor film 208, whereby the off-state current of a transistor can be reduced. Further, since the interface region has the conical or pyramidal microcrystalline semiconductor regions, resistance in the vertical direction (film thickness direction), that is, resistance between the second semiconductor film 208 and a source region or a drain region formed using the impurity semiconductor film 210, can be lowered. Thus, the on-state current of the transistor can be increased. That is to say, as compared to the case of using the conventional amorphous semiconductor, the off-state current can be sufficiently reduced and reduction in the on-state current can be suppressed; thus, switching characteristics of the transistor can be improved.

Note that as a first semiconductor layer formed using the first semiconductor film 206 is thinner in the transistor, the on-state current of the transistor is decreased. As the first semiconductor layer formed using the first semiconductor film 206 is thicker in the transistor, the off-state current of the transistor is increased because the area where the first semiconductor layer formed using the first semiconductor film 206 is in contact with a second conductive layer formed later is increased. Consequently, to increase the on/off ratio, it is preferable to form the first semiconductor film 206 to have a large thickness and further to perform insulation treatment on side surfaces of a thin film stack 212 including the first semiconductor layer formed using the first semiconductor film 206.

Most part of the above microcrystalline semiconductor region preferably includes a crystal grain having a conical or pyramidal shape whose top gets narrower from the first semiconductor film 206 toward the second semiconductor film 208. Alternatively, the most part of the microcrystalline semiconductor region preferably includes a crystal grain whose top gets wider from the first semiconductor film 206 toward the second semiconductor film 208.

When the microcrystalline semiconductor region includes a crystal grain having a conical or pyramidal shape whose top gets narrower from the first semiconductor film 206 toward the second semiconductor film 208 in the above interface region, the proportion of the microcrystalline semiconductor region on the first semiconductor film 206 side is higher than that on the second semiconductor film 208 side. The microcrystalline semiconductor region grows from a surface of the first semiconductor film 206 in the film thickness direction. When the flow rate of hydrogen with respect to that of a deposition gas (e.g., silane) in a source gas is low (that is, the dilution ratio is low) or the concentration of a source gas including nitrogen is high, crystal growth of the microcrystalline semiconductor region is suppressed, and thus, a crystal grain comes to have a conical or pyramidal shape, and most part of the semiconductor formed by the deposition of the crystal grain is amorphous.

The interface region preferably includes nitrogen, in particular, an NH group or an $NH_2$ group. This is because defects are reduced and carriers flow easily when nitrogen, in particular, an NH group or an $NH_2$ group is bonded with dangling bonds of silicon atoms at an interface of a crystal included in the microcrystalline semiconductor region or at the interface between the microcrystalline semiconductor region and the amorphous semiconductor region. Thus, when the interface region includes nitrogen, preferably an NH group or an NH$_2$ group at a concentration of $1\times10^{20}$ cm$^{-3}$ to $1\times10^{21}$ cm$^{-3}$, dangling bonds of silicon atoms can be easily cross-linked with nitrogen, preferably an NH group or an NH$_2$ group, so that carriers can flow more easily. As a result, a bond which promotes the carrier transfer is formed at a crystal grain boundary or a defect, whereby the carrier mobility of the interface region is increased. Therefore, the field effect mobility of the transistor is improved.

Further, when the concentration of oxygen in the interface region is reduced, the defect density at the interface between the microcrystalline semiconductor region and the amorphous semiconductor region or the interface between crystal grains can be reduced, so that bonds inhibiting carrier transfer can be reduced.

The impurity semiconductor film 210 is formed using a semiconductor to which an impurity element imparting one conductivity type is added. In the case where the transistor is an n-channel transistor, for example, silicon to which P or As is added is given as a semiconductor to which an impurity element imparting one conductivity type is added. In the case where the transistor is a p-channel transistor, for example, it is possible to add B as the impurity element imparting one conductivity type; however, it is preferable to use an n-channel transistor. Therefore, silicon to which P is added is used here as an example. The impurity semiconductor film 210 may be formed using an amorphous semiconductor or a crystalline semiconductor such as a microcrystalline semiconductor.

When the impurity semiconductor film 210 is formed of an amorphous semiconductor, the flow rate of a dilution gas is greater than or equal to that of a deposition gas and less than or equal to 10 times that of the deposition gas, preferably greater than or equal to that of the deposition gas and less than or equal to 5 times that of the deposition gas. On the other hand, when the impurity semiconductor film 210 is formed of a crystalline semiconductor, the flow rate of the dilution gas is greater than or equal to 10 times that of a deposition gas and less than or equal to 2000 times that of the deposition gas, preferably greater than or equal to 50 times that of the deposition gas and less than or equal to 200 times that of the deposition gas.

Note that it is preferable that the process from and including the step of forming the first insulating layer 204 to and including the step of forming the impurity semiconductor film 210 be performed successively in the same chamber. This is for the purpose of preventing impurities from being included in any interface between the first insulating layer 204 and the impurity semiconductor film 210.

Figure 1C:
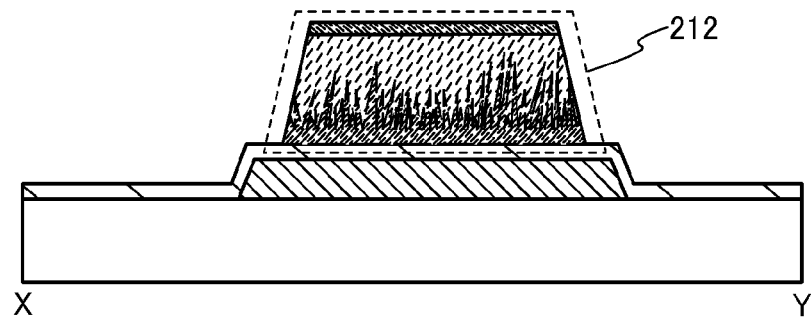

Next, an etching mask 211 is formed over the impurity semiconductor film 210, and the first semiconductor film 206, the second semiconductor film 208, and the impurity semiconductor film 210 are etched using the etching mask 211. After that, the etching mask 211 is removed. In this manner, the thin film stack 212 can be obtained (FIG. 1C). The etching mask 211 may be formed using a resist material.

Note that as described above, it is preferable to perform insulation treatment to the side surfaces of the thin film stack 212. That is because the off-state current increases when the first semiconductor layer and the second conductive layer of the transistor are in contact with each other in many cases. Here, for the insulation treatment, the side surfaces of the thin film stack 212 may be exposed to oxygen plasma or nitrogen plasma. Alternatively, the insulation treatment may be performed as follows: an insulating film is formed while the side surfaces of the thin film stack 212 are exposed, and the insulating film is etched in the direction perpendicular to a surface of the substrate 200 by a method for etching with high anisotropy, so that side wall insulating layers are formed in contact with the side surfaces of the thin film stack 212.

Figure 1D:
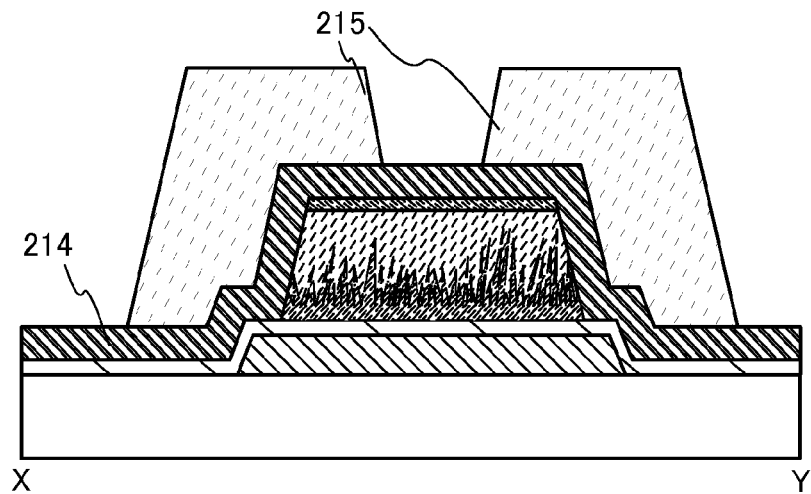

Next, a conductive film 214 is formed over the first insulating layer 204 and the thin film stack 212. An etching mask 215 is formed over the conductive film 214 (FIG. 1D).

The conductive film 214 may be formed of a conductive material (e.g., metal or a semiconductor to which an impurity element imparting one conductivity type is added) in a manner similar to that of the first conductive layer 202. Note that the conductive film 214 may have a single-layer structure or a layered structure including plural layers. For example, the conductive film 214 may be formed to have a three-layer structure in which an Al layer is sandwiched between Ti layers.

Figure 2A:
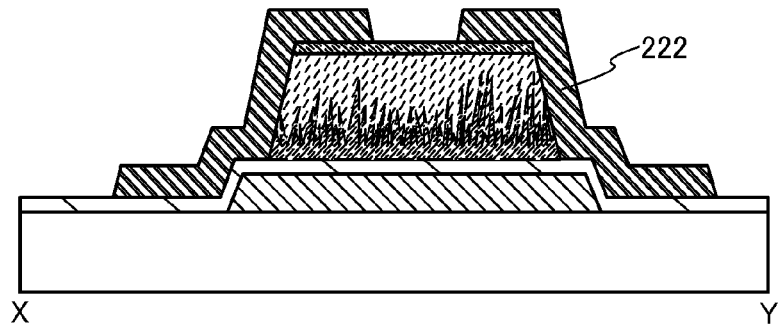
FIGS. 2A to 2D illustrate a method for manufacturing a semiconductor device of one embodiment of the present invention.

Next, the conductive film 214 is etched with the use of the etching mask 215, so that a second conductive layer 222 is formed (FIG. 2A). Then, the etching mask 215 is removed. Note that the second conductive layer 222 forms at least a signal line and a source and drain electrodes.

Figure 2B:
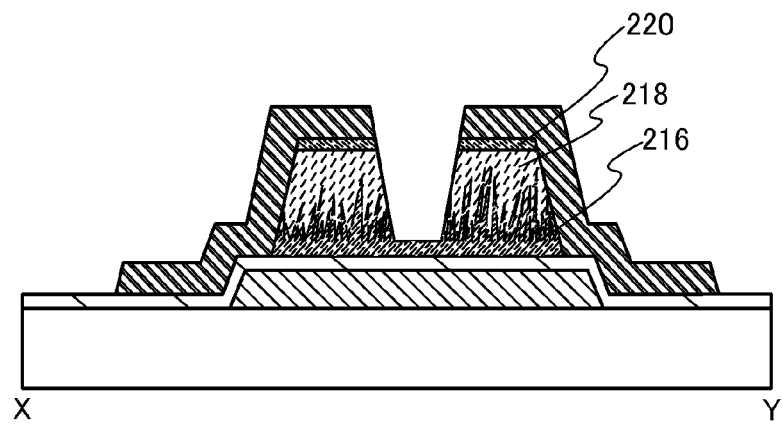

Next, the thin film stack 212 is etched using the second conductive layer 222 as an etching mask. Here, a first etching and a second etching are performed. The first etching is performed with the use of a CF$_4$ gas, and the second etching is performed with the use of a mixed gas including an HBr gas, a CF$_4$ gas, and an oxygen gas. By performing the first etching with the use of a CF$_4$ gas, even in the case where a natural oxide film is formed on the surface of the second semiconductor film 208, the natural oxide film can be removed and the second semiconductor film 208 can be etched. Further, by performing the second etching with the use of a mixed gas including an HBr gas, a CF$_4$ gas, and an oxygen gas, when the first semiconductor film 206 is a crystalline semiconductor film and the second semiconductor film 208 is an amorphous semiconductor film, high etching selectivity can be obtained between a layer formed using the first semiconductor film 206 and a layer formed using the second semiconductor film 208. Even in the case where part of the second semiconductor film 208 which does not overlap with the second conductive layer 222 is removed to expose part of the layer formed using the first semiconductor film 206 which does not overlap with the second conductive layer 222, reduction in the film thickness of part of a first semiconductor layer 216 which does not overlap with the second conductive layer 222 can be suppressed (FIG. 2B).

In other words, one embodiment of the present invention is a method for etching including the step of performing at least a first etching and a second etching on part of the stacked semiconductor film (the thin film stack 212) in which an amorphous semiconductor film is provided on a crystalline semiconductor film to expose part of the crystalline semiconductor film provided in the stacked semiconductor film. The first etching is performed with the use of a CF$_4$ gas and the second etching is performed with the use of a mixed gas including an HBr gas, a CF$_4$ gas, and an oxygen gas.

Alternatively, one embodiment of the present invention is a method for etching including the steps of forming an etching mask over a first region of a stacked semiconductor film in which an amorphous semiconductor film is provided on a crystalline semiconductor film, and exposing part of the crystalline semiconductor film in a second region by at least a first etching and a second etching. The first etching is performed with the use of a CF$_4$ gas and the second etching is performed with the use of a mixed gas including an HBr gas, a CF$_4$ gas, and an oxygen gas.

Note that the second etching may be performed with a bias power which is greater than 0 W and less than or equal to 100 W. In the second etching, the area of the smaller electrode of the upper and lower electrodes in the etching device is preferably more than or equal to 340 cm$^2$.

Note that the flow ratio of an HBr gas, a CF$_4$ gas, and an oxygen gas of the second etching is preferably 24:1:1.

Note that the second etching may be performed with the use of the etching mask 215.

Then, the above-described exposed first semiconductor layer 216 is preferably exposed to H$_2$O plasma. Alternatively, plasma generated by a mixed gas of hydrogen and oxygen is preferably used instead of H$_2$O plasma.

Through the above steps, the transistor can be manufactured. Such a transistor can be applied to a pixel transistor used in a pixel of a display device. The method for manufacturing the pixel transistor will be described below.

Figure 2C:
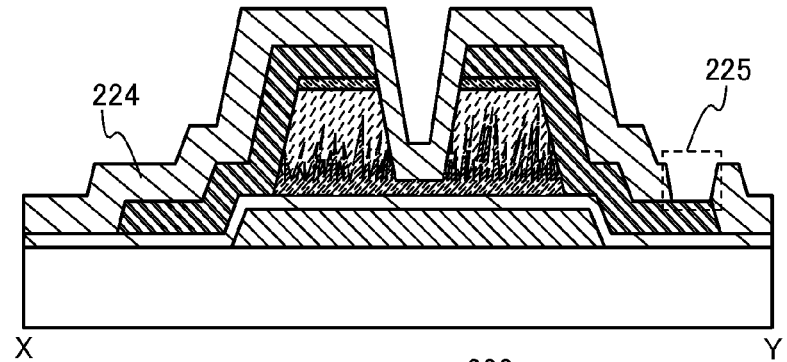

Then, a second insulating layer 224 is formed so as to cover these layers. Note that the second insulating layer 224 is formed so as to cover at least the exposed portion of the first semiconductor layer 216. Then, an opening portion 225 is formed in the second insulating layer 224 (FIG. 2C).

An etching mask is formed over the second insulating layer 224 and etching is performed, so that the opening portion 225 is formed.

Next, a third conductive layer 226 is selectively formed so as to be electrically connected to one of the source and drain electrodes formed using the second conductive layer 222 through the opening portion 225.

The third conductive layer 226 is preferably formed of a light-transmitting material because the third conductive layer 226 forms a pixel electrode connected to the pixel transistor. A conductive film is formed over the second insulating layer 224, an etching mask is formed over the conductive film, and etching is performed thereon, so that the third conductive layer 226 is formed.

The third conductive layer 226 can be formed using a conductive composition including a conductive high molecule (also referred to as a conductive polymer) having a light-transmitting property. It is preferable that the third conductive layer 226 formed using the conductive composition have a sheet resistance of less than or equal to 10000 a/square and a light transmittance of greater than or equal to 70% at a wavelength of 550 nm. Further, the resistivity of the conductive high molecule included in the conductive composition is preferably less than or equal to 0.1Ω·cm.

As the conductive high molecular, a "it electron conjugated conductive high molecule" can be used. For example, polyaniline or a derivative thereof, polypyrrole or a derivative thereof, polythiophene or a derivative thereof, and a copolymer of two or more of aniline, pyrrole, and thiophene or a derivative thereof can be given.

The third conductive layer 226 can be formed using, for example, indium oxide including tungsten oxide, indium zinc oxide including tungsten oxide, indium oxide including titanium oxide, indium tin oxide including titanium oxide, indium tin oxide (ITO), indium zinc oxide, indium tin oxide to which silicon oxide is added, or the like.

Although not shown, an insulating layer formed of an organic resin by a spin coating method or the like may be provided between the second insulating layer 224 and the third conductive layer 226.

Note that the above-described thin film transistor in this embodiment is a preferable embodiment, but one embodiment of the present invention is not limited thereto. For example, the first semiconductor film 206 is not necessarily a microcrystalline semiconductor film, and the second semiconductor film 208 does not necessarily include a minute semiconductor crystal grain.

Figure 2D:
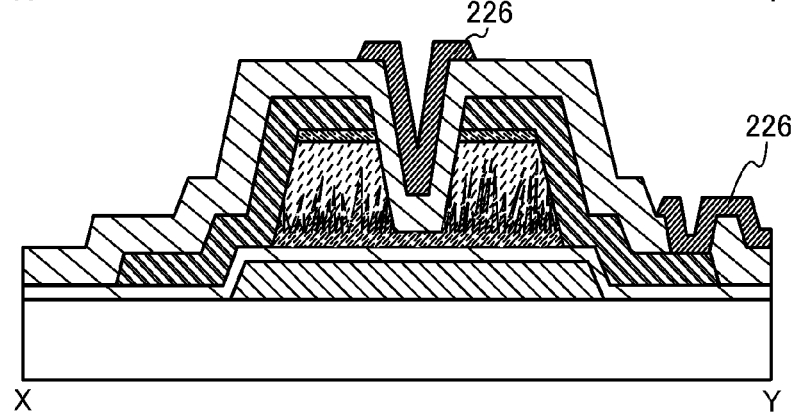

As described above, the thin film transistor illustrated in FIG. 2D can be manufactured while reduction in the film thickness of the first semiconductor layer 216 is suppressed. Consequently, a thin film transistor with high electric characteristics (e.g., low off-state current) can be manufactured.

Embodiment 2

The thin film transistor described in Embodiment 1 is provided with the third conductive layer 226 so as to overlap with the channel formation regions. The third conductive layer 226 functions as a back gate electrode. In this embodiment, a method for providing a back gate electrode for a thin film transistor will be described.

FIGS. 3A to 3D each illustrate a top view of a thin film transistor provided with a back gate electrode. Note that a cross-sectional structure of the thin film transistor is similar to that in Embodiment 1.

Figure 3C:
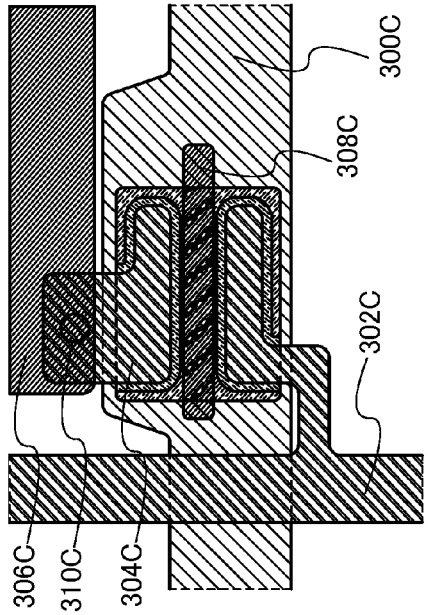
FIGS. 3A to 3D each illustrate a semiconductor device of one embodiment of the present invention.
Figure 3D:
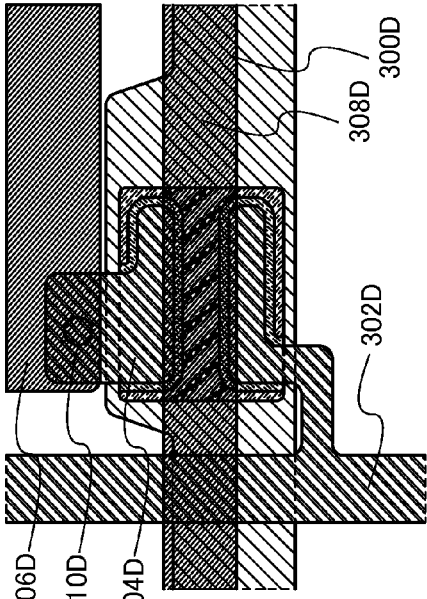
Figure 3A:
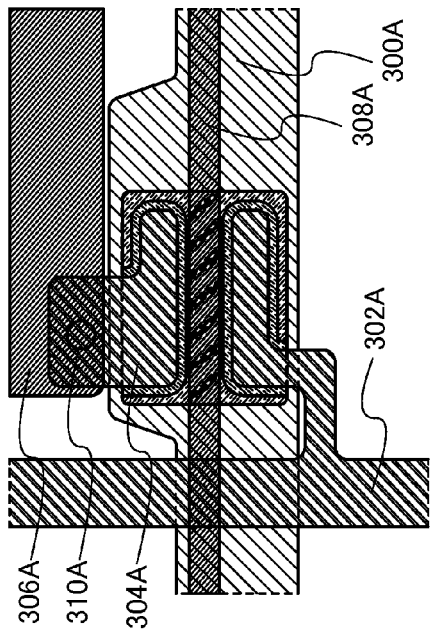

First, as illustrated in FIG. 3A, a back gate 308A can be formed so as not to be electrically connected to a gate 300A but to be electrically independent from the gate 300A. By arranging the back gate 308A as illustrated in FIG. 3A, a potential supplied to the back gate 308A and a potential supplied to the gate 300A can be controlled to be independent from each other. Thus, the threshold voltage of the thin film transistor can be controlled. Further, a region where carriers flow is formed in both the gate side and the back gate side of a channel formation region formed using a first semiconductor layer, so that the on-state current of the thin film transistor can be increased.

Note that the gate 300A illustrated in FIG. 3A is a gate electrode and a gate wiring and is formed using the first conductive layer 202 in Embodiment 1.

Note that a wiring 302A illustrated in FIG. 3A is a source electrode and a source wiring and is formed using the second conductive layer 222 in Embodiment 1.

Note that an electrode 304A illustrated in FIG. 3A is a drain electrode and is formed using the second conductive layer 222 in Embodiment 1.

Note that a pixel electrode 306A illustrated in FIG. 3A is a pixel electrode and is formed using the third conductive layer 226 in Embodiment 1.

Note that the back gate 308A illustrated in FIG. 3A is a back gate electrode and a back gate wiring and is formed using the third conductive layer 226 in Embodiment 1.

Note that an opening portion 310A illustrated in FIG. 3A corresponds to the opening portion 225 in Embodiment 1.

Figure 3B:
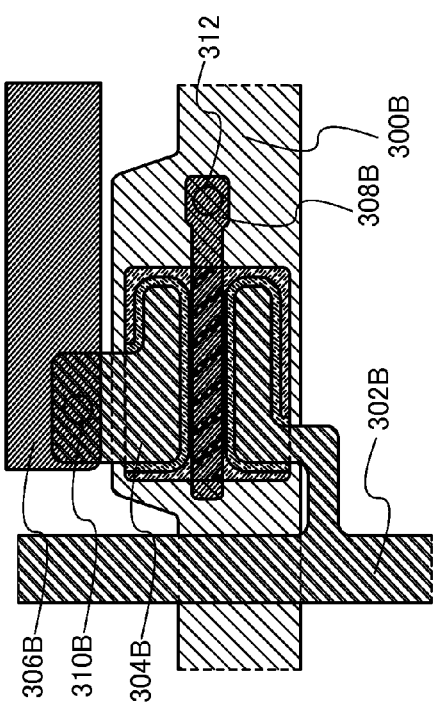

As illustrated in FIG. 3B, a back gate may be electrically connected to a gate. In FIG. 3B, a gate 300B is electrically connected to a back gate 308B in an opening portion 312. Thus, the potential of the gate is substantially equal to the potential of the back gate. Consequently, similarly to FIG. 3A, a region where carriers flow is formed in both the gate side and the back gate side of a channel formation region formed using a first semiconductor layer, so that the on-state current of the thin film transistor can be increased.

Note that the gate 300B illustrated in FIG. 3B is a gate electrode and a gate wiring and is formed using the first conductive layer 202 in Embodiment 1.

Note that a wiring 302B illustrated in FIG. 3B is a source electrode and a source wiring and is formed using the second conductive layer 222 in Embodiment 1.

Note that an electrode 304B illustrated in FIG. 3B is a drain electrode and is formed using the second conductive layer 222 in Embodiment 1.

Note that a pixel electrode 306B illustrated in FIG. 3B is a pixel electrode and is formed using the third conductive layer 226 in Embodiment 1.

Note that the back gate 308B illustrated in FIG. 3B is a back gate electrode and is formed using the third conductive layer 226 in Embodiment 1.

Note that an opening portion 310B illustrated in FIG. 3B corresponds to the opening portion 225 in Embodiment 1.

Note that the opening portion 312 illustrated in FIG. 3B is formed in the same step as the step of the opening portion 225 in Embodiment 1. In the opening portion 312, the gate 300B and the back gate 308B are connected with each other.

As illustrated in FIG. 3C, a back gate may be in a floating state without electrically connecting to a gate electrode and without leading independently.

Note that a gate 300C illustrated in FIG. 3C is a gate electrode and a gate wiring and is formed using the first conductive layer 202 in Embodiment 1.

Note that a wiring 302C illustrated in FIG. 3C is a source electrode and a source wiring and is formed using the second conductive layer 222 in Embodiment 1.

Note that an electrode 304C illustrated in FIG. 3C is a drain electrode and is formed using the second conductive layer 222 in Embodiment 1.

Note that a pixel electrode 306C illustrated in FIG. 3C is a pixel electrode and is formed using the third conductive layer 226 in Embodiment 1.

Note that a back gate 308C illustrated in FIG. 3C is a back gate electrode and is formed using the third conductive layer 226 in Embodiment 1.

Note that an opening portion 310C illustrated in FIG. 3C corresponds to the opening portion 225 in Embodiment 1.

As illustrated in FIG. 3D, a back gate may be provided so as to overlap with a source electrode and a drain electrode. Here, a thin film transistor having the structure illustrated in FIG. 3A is described; however, the back gates illustrated in FIGS. 3B and 3C may each overlap with a source electrode and a drain electrode formed using the second conductive layer 222 in a manner similar to that in FIG. 3A.

Note that a gate 300D illustrated in FIG. 3D is a gate electrode and a gate wiring and is formed using the first conductive layer 202 in Embodiment 1.

Note that a wiring 302D illustrated in FIG. 3D is a source electrode and a source wiring and is formed using the second conductive layer 222 in Embodiment 1.

Note that an electrode 304D illustrated in FIG. 3D is a drain electrode and is formed using the second conductive layer 222 in Embodiment 1.

Note that a pixel electrode 306D illustrated in FIG. 3D is a pixel electrode and is formed using the third conductive layer 226 in Embodiment 1.

Note that a back gate 308D illustrated in FIG. 3D is a back gate electrode and a back gate wiring and is formed using the third conductive layer 226 in Embodiment 1.

Note that an opening portion 310D illustrated in FIG. 3D corresponds to the opening portion 225 in Embodiment 1.

Embodiment 3

As a semiconductor device to which the thin film transistor manufactured in the above embodiment is applied, electronic paper can be given. Electronic paper can be used for electronic appliances of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like. An example of such electronic appliances is illustrated in FIG. 4.

Figure 4:
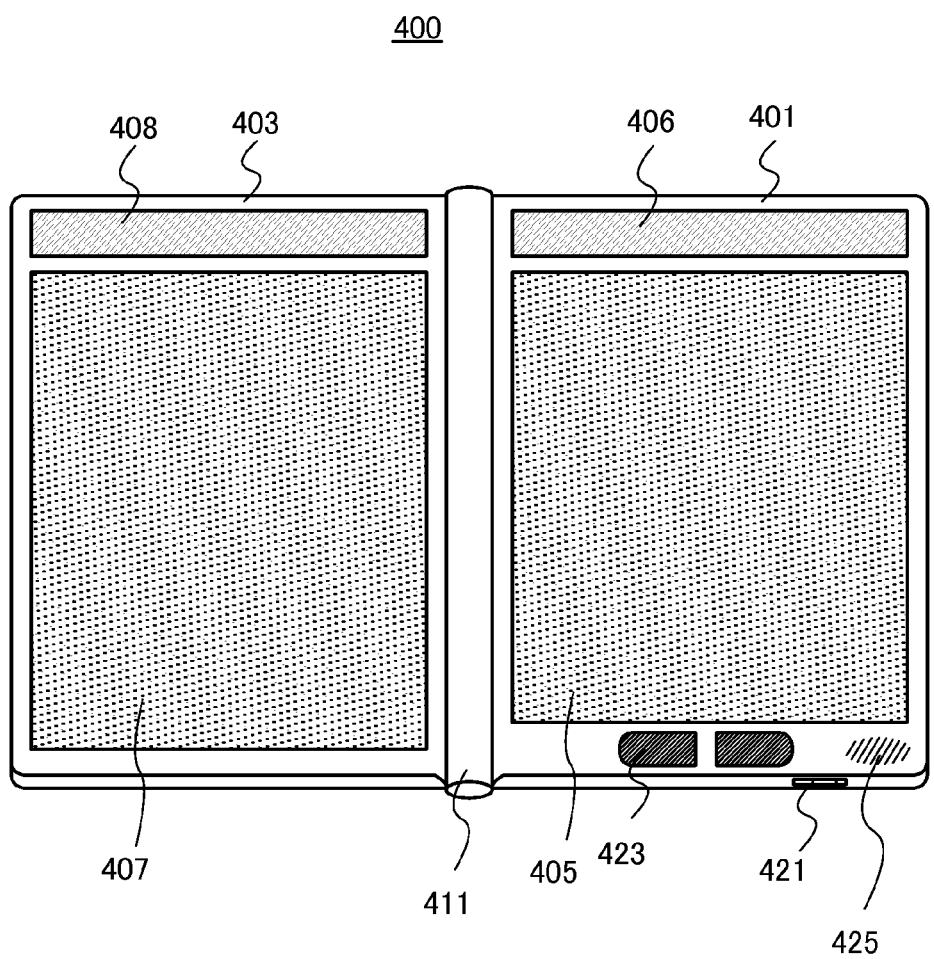
FIG. 4 illustrates a semiconductor device of one embodiment of the present invention.

FIG. 4 illustrates an example of an electronic book reader. For example, an electronic book reader 400 includes two housings 401 and 403. The housings 401 and 403 are combined with each other with a hinge 411 so that the electronic book reader 400 can be opened and closed with the hinge 411 as an axis. With such a structure, the electronic book reader 400 can be handled like a paper book.

A display portion 405 and a photoelectric conversion device 406 are incorporated in a housing 401. A display portion 407 and a photoelectric conversion device 408 are incorporated in a housing 403. The display portions 405 and 407 may display one image or different images. In the case where the display portions 405 and 407 display different images, for example, a display portion on the right side (the display portion 405 in FIG. 4) can display text and a display portion on the left side (the display portion 407 in FIG. 4) can display images.

FIG. 4 illustrates an example in which the housing 401 includes an operation portion and the like. For example, the housing 401 includes a power source 421, operation keys 423, a speaker 425, and the like. Pages can be turned by the operation keys 423. Note that a keyboard, a pointing device, or the like may also be provided on the surface of the housing, on which the display portion is provided. Furthermore, an external connection terminal (an earphone terminal, a USB terminal, a terminal that can be connected to an AC adapter, various cables such as a USB cable, or the like), a recording medium insertion portion, and the like may be provided on the back surface or the side surface of the housing. Furthermore, the electronic book reader 400 may function as an electronic dictionary.

Further, the electronic book reader 400 may transmit and receive data wirelessly. Through wireless communication, desired book data or the like can be purchased and downloaded from an electronic book server.

Embodiment 4

As the semiconductor device to which the thin film transistor manufactured in the above embodiment is applied, various electronic appliances (including amusement machines) can be given, in addition to electronic paper. Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 5A:
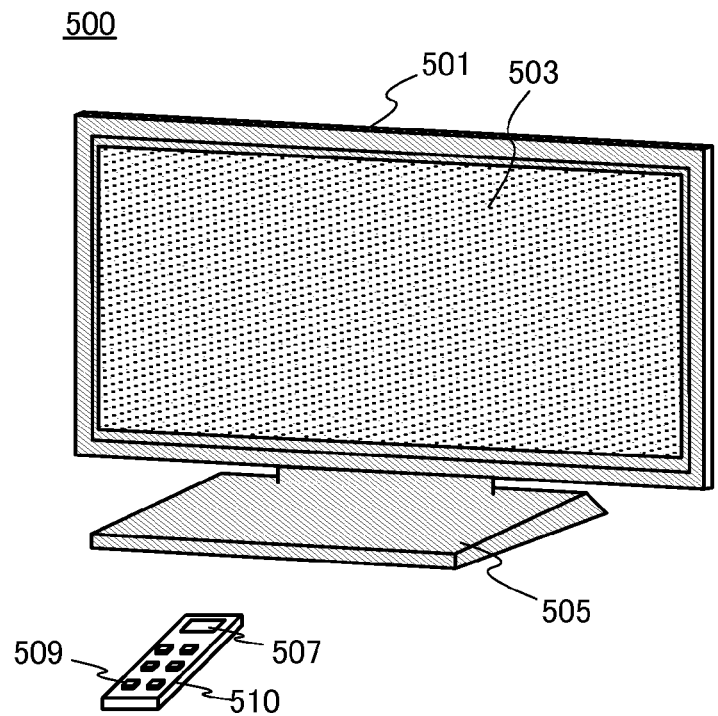
FIGS. 5A and 5B each illustrate a semiconductor device of one embodiment of the present invention.

FIG. 5A illustrates an example of a television set. In a television set 500, a display portion 503 is incorporated in a housing 501. Images can be displayed on the display portion 503. Here, the housing 501 is supported by a stand 505.

The television set 500 can be operated by an operation switch of the housing 501 or a separate remote controller 510. Channels can be switched and volume can be controlled with operation keys 509 of the remote controller 510, whereby an image displayed on the display portion 503 can be controlled. The remote controller 510 may be provided with a display portion 507 for displaying data output from the remote controller 510.

Note that the television set 500 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 5B:
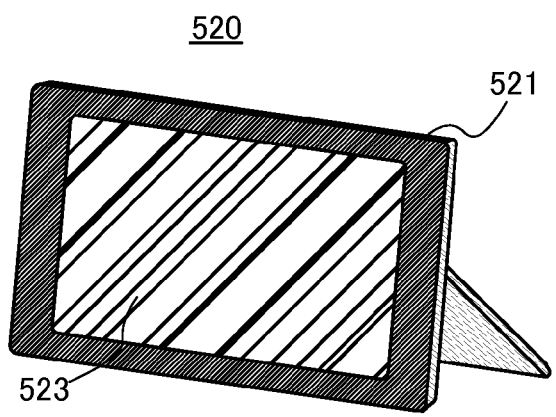

FIG. 5B illustrates an example of a digital photo frame. For example, a display portion 523 is incorporated in a housing 521 of a digital photo frame 520. The display portion 523 can display a variety of images. For example, the display portion 523 can display data of an image taken with a digital camera or the like and function as a normal photo frame.

Note that the digital photo frame 520 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 520. For example, a memory storing data of an image taken with a digital camera is inserted into the storage medium inserting portion of the digital photo frame and the image data is imported, whereby the imported image data can be displayed on the display portion 523.

The digital photo frame 520 may have a structure capable of wirelessly transmitting and receiving data. The structure may be employed in which desired image data is transferred wirelessly to be displayed.

Figure 6:
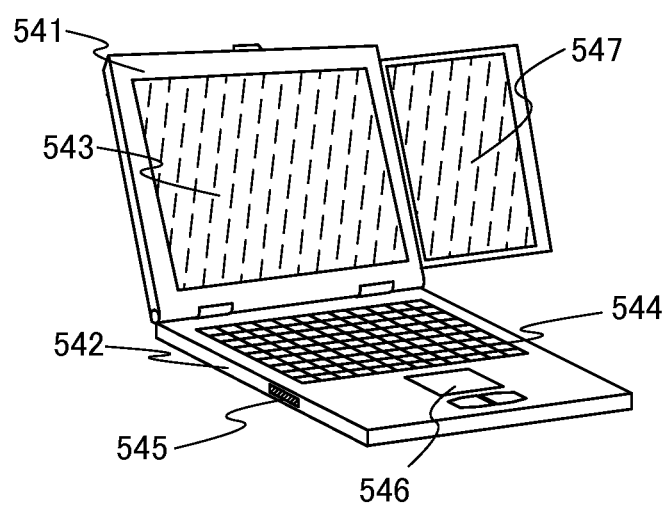
FIG. 6 illustrates a semiconductor device of one embodiment of the present invention.

FIG. 6 is a perspective view illustrating an example of a portable computer.

In the portable computer of FIG. 6, a top housing 541 having a display portion 543 and a bottom housing 542 having a keyboard 544 can overlap with each other by closing a hinge unit which connects the top housing 541 and the bottom housing 542. The portable computer of FIG. 6 can be convenient for carrying, and in the case of using the keyboard for input, the hinge unit is opened and the user can input looking at the display portion 543.

The bottom housing 542 has a pointing device 546 with which input can be performed, in addition to the keyboard 544. When the display portion 543 is a touch screen, input can be performed by touching part of the display portion 543. The bottom housing 542 includes an arithmetic function portion such as a CPU or hard disk. In addition, the bottom housing 542 has an external connection port 545 into which another device, for example, a communication cable compliant with communication standards of a USB is inserted.

The top housing 541 further includes a display portion 547 which can be kept in the top housing 541 by being slid therein. Thus, a large display screen can be realized. In addition, the user can adjust the orientation of a screen of the display portion 547 which can be kept in the top housing 541. When the display portion 547 which can be kept in the top housing 541 is a touch screen, input can be performed by touching part of the display portion 547 which can be kept in the top housing 541.

The display portion 543 or the display portion 547 which can be kept in the top housing 541 is formed with a liquid crystal display panel, a light-emitting display panel such as an organic light-emitting element or an inorganic light-emitting element, or the like.

In addition, the portable computer illustrated in FIG. 6 can include a receiver and the like and can receive a TV broadcast to display images on the display portion. The user can watch a television broadcast when the whole screen of the display portion 547 is exposed by sliding the display portion 547 and the angle of the screen is adjusted while the hinge unit which connects the top housing 541 and the bottom housing 542 is kept closed. In this case, the hinge unit is not opened and display is not performed on the display portion 543. In addition, start up of only a circuit for displaying television broadcast is performed. Therefore, power consumption can be the minimum, which is useful for the portable computer whose battery capacity is limited.

Example 1

In this example, the thin film transistors were manufactured using a method for manufacturing a semiconductor device of one embodiment of the present invention and the characteristics of the thin film transistors were examined for comparison. Here, Example Sample and Comparative Sample were manufactured. The thin film transistors manufactured in the Example are shown in FIG. 2C.

First, a 200-nm-thick base film formed of SiON was formed over a substrate 200 by a plasma CVD method. Next, a conductive film to be the first conductive layer 202 was formed over the base film by a sputtering method and processed, so that the first conductive layer 202 was formed. The first conductive layer 202 had a structure in which a 50-nm-thick Ti layer, a 100-nm-thick Al layer, and a 50-nm-thick Ti layer were stacked.

Next, the 300-nm-thick first insulating layer 204 formed of silicon nitride was formed to cover the first conductive layer 202 by a plasma CVD method. Specifically, a monosilane gas, an ammonia gas, a nitrogen gas, and a hydrogen gas were introduced at 15 sccm, 500 sccm, 180 sccm, and 200 sccm respectively into a reaction chamber where the substrate was placed; the pressure in the reaction chamber was set at 100 Pa; the distance between an upper electrode and a lower electrode in the reaction chamber was set at 30 mm; and high-frequency power with a frequency of 13.56 MHz and electrical power of 200 W was supplied to the upper electrode. Note that the temperature of the upper electrode was set at 250° C. and the temperature of the lower electrode was set at 290° C.

Next, plasma treatment was performed on a surface of the first insulating layer 204. Specifically, a dinitrogen monoxide ($N_2O$) gas was introduced at 400 sccm into a reaction chamber where the substrate was placed, the pressure in the reaction chamber was set at 60 Pa, the distance between an upper electrode and a lower electrode which were provided in the reaction chamber was set at 30 mm, and high-frequency power with a frequency of 13.56 MHz and electrical power of 300 W was supplied to the upper electrode. Note that the temperature of the upper electrode was set at 250° C. and the temperature of the lower electrode was set at 290° C.

Next, the first semiconductor film 206 was formed over the first insulating layer 204 after the plasma treatment. Note that in this example, the first semiconductor film 206 was formed through the two-step film formation process. Through the two-step film formation process, a 5-nm-thick microcrystalline silicon film was formed at the first stage and a 65-nm-thick microcrystalline silicon film was formed at the second stage. Specifically, at the first stage, a monosilane gas, an argon gas, and a hydrogen gas were introduced at 4 sccm, 750 sccm, and 750 sccm respectively into a reaction chamber where the substrate was placed; the pressure in the reaction chamber was set at 532 Pa; the distance between an upper electrode and a lower electrode in the reaction chamber was set at 15 mm; and high-frequency power with a frequency of 13.56 MHz and electrical power of 150 W was supplied to the upper electrode. Note that the temperature of the upper electrode was set at 250° C. and the temperature of the lower electrode was set at 290° C. At the second stage, a monosilane gas, an argon gas, and a hydrogen gas were introduced at 1.8 sccm, 750 sccm, and 750 sccm respectively into a reaction chamber where the substrate was placed; the pressure in the reaction chamber was set at 5000 Pa; the distance between the upper electrode and the lower electrode in the reaction chamber was set at 7 mm; and high-frequency power with a frequency of 13.56 MHz and electrical power of 125 W was supplied to the upper electrode. Note that the temperature of the upper electrode was set at 250° C. and the temperature of the lower electrode was set at 290° C.

Next, the 90-nm-thick second semiconductor film 208 was formed over the first semiconductor film 206. Specifically, a monosilane gas, an ammonia gas diluted with hydrogen, an argon gas, and a hydrogen gas were introduced at 20 sccm, 50 sccm, 750 sccm, and 700 sccm respectively into a reaction chamber where the substrate was placed; the pressure in the reaction chamber was set at 350 Pa; the distance between an upper electrode and a lower electrode in the reaction chamber was set at 25 mm; and high-frequency power with a frequency of 13.56 MHz and electrical power of 60 W was supplied to the upper electrode. Note that the temperature of the upper electrode was set at 250° C. and the temperature of the lower electrode was set at 290° C.

Note that here, the ammonia gas diluted with hydrogen was a gas obtained by diluting an ammonia gas with hydrogen to 1000 ppm.

Next, the 50-nm-thick impurity semiconductor film 210 was formed over the second semiconductor film 208. Specifically, a monosilane gas, a phosphine gas diluted with hydrogen, and a hydrogen gas were introduced at 80 sccm, 150 sccm, and 750 sccm respectively into a reaction chamber where the substrate was placed; the pressure in the reaction chamber was set at 350 Pa; the distance between an upper electrode and a lower electrode in the reaction chamber was set at 15 mm; and high-frequency power with a frequency of 13.56 MHz and electrical power of 30 W was supplied to the upper electrode. Note that the temperature of the upper electrode was set at 250° C. and the temperature of the lower electrode was set at 290° C.

Here, a phosphine gas diluted with hydrogen was a gas obtained by diluting a phosphine gas with hydrogen to 0.5%.

Next, the etching mask 211 was formed over the impurity semiconductor film 210 using a resist material. Then, the first semiconductor film 206, the second semiconductor film 208, and the impurity semiconductor film 210 were etched using the etching mask 211, so that the thin film stack 212 was formed. Here, the etching was performed by reactive ion etching. Specifically, a boron trichloride ($BCl_3$) gas, a tetrafluoromethane ($CF_4$) gas, and an oxygen gas were introduced 36 sccm, 36 sccm, and 8 sccm respectively into a reaction chamber where the substrate was placed, the pressure in the reaction chamber was set at 2.0 Pa, high-frequency power with a frequency of 13.56 MHz and electrical power of 450 W was supplied to an upper electrode, and the bias power between the upper electrode and a lower electrode was set at 100 W. Note that the temperature of the upper electrode was set at 100° C. and the temperature of the lower electrode was set at 70° C.

Next, oxygen plasma treatment was performed on the thin film stack 212. Specifically, an oxygen gas was introduced at 100 sccm into a reaction chamber where the substrate was placed, the pressure in the reaction chamber was set at 0.67 Pa, the distance between an upper electrode and a lower electrode in the reaction chamber was set at 200 mm, high-frequency power of 2000 W was supplied to the upper electrode, and the bias power was set at 350 W. Note that the temperature of the lower electrode was set at −10° C.

Then, the etching mask 211 was removed.

Next, the 300-nm-thick conductive film 214 was formed to cover the thin film stack 212 by a sputtering method. The etching mask 215 was formed on the conductive film 214. The conductive film 214 had a structure in which a 50-nm-thick Ti layer, a 200-nm-thick Al layer, and a 50-nm-thick Ti layer were stacked.

Then, the conductive film 214 was etched using the etching mask 215, so that the second conductive layer 222 was formed and an upper portion of the thin film stack 212 was etched. Through this etching, the impurity semiconductor film 210 was etched to form an impurity semiconductor layer 220 and only an upper portion of the second semiconductor film 208 was etched. Specifically, a boron trichloride ($BCl_3$) gas and a chlorine gas were introduced at 60 sccm, and 20 sccm respectively into a reaction chamber where the substrate was placed, the pressure in the reaction chamber was set at 1.9 Pa, high-frequency power with a frequency of 13.56 MHz and electrical power of 450 W was supplied to an upper electrode, and the bias power between the upper electrode and a lower electrode was set at 100 W. Note that the temperature of the upper electrode was set at 100° C. and the temperature of the lower electrode was set at 70° C. Then, the etching mask 215 was removed.

Next, the second semiconductor film 208 whose upper portion was etched was further etched and part of the first semiconductor film 206 was etched, so that the first semiconductor layer 216 and a second semiconductor layer 218 were formed. Here, in Example Sample, a first etching was performed with the use of a $CF_4$ gas, and a second etching was performed with the use of a mixed gas including an HBr gas, a $CF_4$ gas, and an oxygen gas. In Comparative Sample, etching was performed with the use of a $CF_4$ gas. Detailed etching conditions of Example Sample are shown below in Table 1. Note that here, the area of the smaller electrode (the upper electrode) of the upper and lower electrodes used in the etching device was 340 $cm^2$. Note that the temperature of the upper electrode was set at 100° C. and the temperature of the lower electrode was set at 70° C.

TABLE 1

|  | ICP electrical power [W] | bias power [W] | pressure [Pa] | flow rate (sccm) | | |
|---|---|---|---|---|---|---|
|  |  |  |  | HBr | $CF_4$ | $O_2$ |
| first etching | 500 | 50 | 2.0 |  | 80 |  |
| second etching | 500 | 50 | 1.7 | 120 | 5 | 5 |

In Comparative Sample, a $CF_4$ gas was introduced at 100 sccm into a reaction chamber where the substrate was placed, the pressure in the reaction chamber was set at 0.67 Pa, the distance between an upper electrode and a lower electrode in the reaction chamber was set at 200 mm, high-frequency power of 1000 W was supplied to the upper electrode, and the bias power was set at 50 W. Note that the temperature of the lower electrode was set at 40° C.

After the etching process in Example Sample and Comparative Sample, pure water cleaning was performed.

Next, an exposed portion of the first semiconductor layer 216 was exposed to $H_2O$ plasma. Specifically, a water vapor ($H_2O$) gas was introduced at 300 sccm into a reaction chamber where the substrate was placed, the pressure in the reaction chamber was set at 66.5 Pa, and high-frequency power with a frequency of 13.56 MHz and electrical power of 1800 W was supplied. Note that the temperature of the lower electrode was set at 250° C.

A 300-nm-thick second insulating film formed of silicon nitride which is to be the second insulating layer 224 was formed to cover the first semiconductor layer 216, the second semiconductor layer 218, the impurity semiconductor layer 220, and the second conductive layer 222 by a plasma CVD method.

Figure 7A:
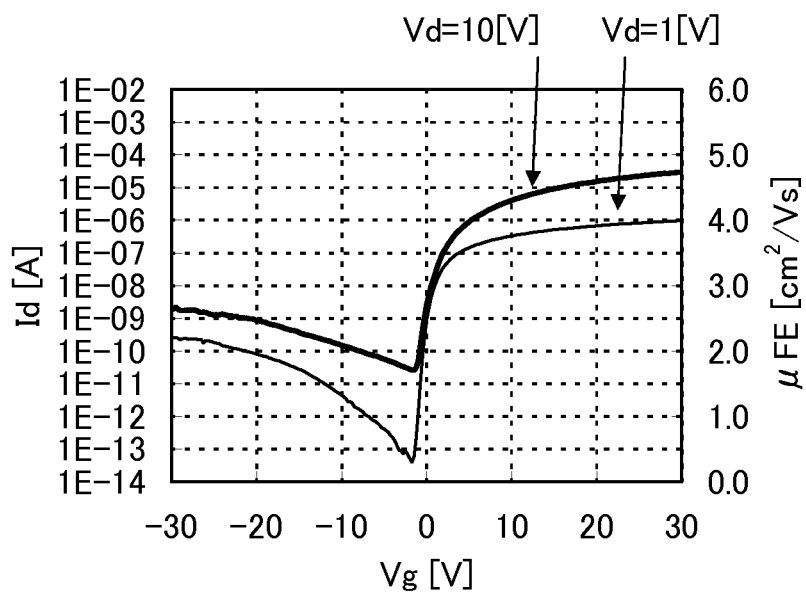
FIGS. 7A and 7B show characteristics of Comparative Sample A and Example Sample B in Example 1.
Figure 7B:
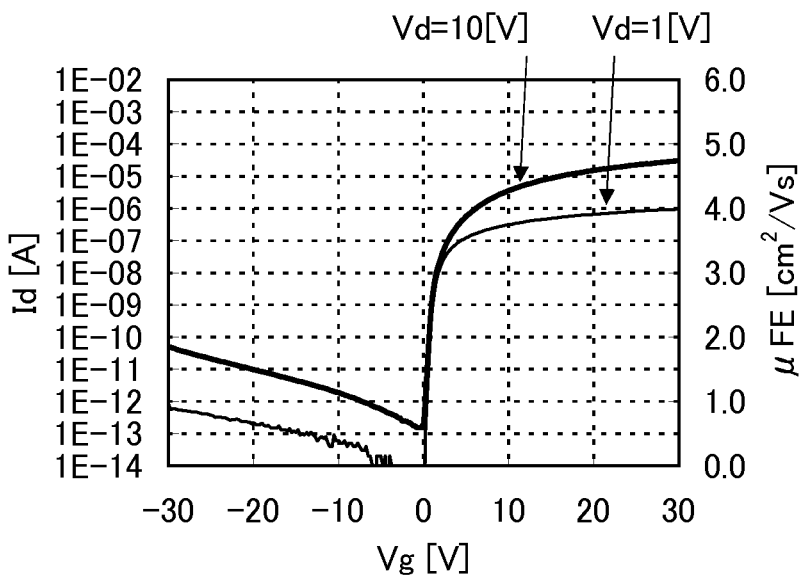

Id-Vg curves of Example Sample and Comparative Sample formed as described above were obtained. FIG. 7A shows the Id-Vg curve obtained from Comparative Sample and FIG. 7B shows the Id-Vg curve obtained from Example Sample. The Id-Vg curves shown in FIGS. 7A and 7B are those obtained from respective thin film transistors positioned near the center of the substrate.

Here, Id refers to a current flowing between a source electrode and a drain electrode of the transistor; Vg refers to the potential difference between the potential of the source electrode and the potential of a gate electrode of the transistor in the case where the potential of the source electrode is a reference potential.

In Example Sample and Comparative Sample, when the values obtained from the plurality of samples provided within the substrate are compared, it is found that the subthreshold swing value of Example Sample can be smaller than that of Comparative Sample.

In Example Sample and Comparative Sample, when the values obtained from the plurality of samples provided within the substrate are compared, it is found that the threshold voltage can be more shifted in the positive direction in Example Sample as compared to Comparative Sample.

In Example Sample and Comparative Sample, when the values obtained from the plurality of samples provided within the substrate are compared, it is found that the off-state current of Example Sample can be lower than that of Comparative Sample.

The results of comparing the above electric characteristics are shown in Table 2.

TABLE 2

| | S value [V/dec.] | threshold voltage [V] | Ioff [pA] (minimum) | Ioff [pA] (at Vg which is lower than Vg at the minimum by 10 V) |
|---|---|---|---|---|
| Example Sample | 0.24 | 1.98 ± 0.2 | 0.29 | 3.66 |
| Comparative Sample | 0.44 | 1.21 ± 0.6 | 1005 | 3430 |

As described above, when the semiconductor device of one embodiment of the present invention is used, at least an S value can be small, a threshold voltage can be shifted to the positive side, and the off-state current can be reduced.

Moreover, at the time when etching for exposing a channel formation region is performed, the bias power may be reduced. The bias power may be greater than 0 W and less than or equal to 100 W, more preferably greater than 0 W and less than or equal to 50 W.

This application is based on Japanese Patent Application serial No. 2010-232823 filed with Japan Patent Office on Oct. 15, 2010, the entire contents of which are hereby incorporated by reference.

What is claimed is:

1. A method for manufacturing a semiconductor device, comprising the steps of:
forming a stacked semiconductor film including a crystalline semiconductor film and an amorphous semiconductor film over the crystalline semiconductor film; and
performing a first etching and a second etching on a part of the stacked semiconductor film to expose a part of the crystalline semiconductor film,
wherein the first etching is performed using a first gas including a $CF_4$ gas, and
wherein the second etching is performed using a second gas including an HBr gas, a $CF_4$ gas and an oxygen gas.

2. The method for manufacturing a semiconductor device, according to claim 1, wherein the second etching is performed with bias power which is greater than 0 W and less than or equal to 100 W.

3. The method for manufacturing a semiconductor device, according to claim 1, wherein a flow ratio of the HBr gas, the $CF_4$ gas, and the oxygen gas in the second etching is 24:1:1.

4. The method for manufacturing a semiconductor device, according to claim 1, wherein the crystalline semiconductor film is a microcrystalline semiconductor film.

5. The method for manufacturing a semiconductor device, according to claim 4,
wherein the microcrystalline semiconductor film is formed of microcrystalline silicon, and
wherein the amorphous semiconductor film is formed of amorphous silicon.

6. The method for manufacturing a semiconductor device, according to claim 1, wherein a concentration of oxygen and nitrogen included in the crystalline semiconductor film is lower than $1.0 \times 10^{18}$ atoms/cm$^3$.

7. The method for manufacturing a semiconductor device, according claim 1, further comprising the step of performing an insulation treatment on a side surface of the stacked semiconductor film.

8. A method for manufacturing a semiconductor device, comprising the steps of:
forming a stacked semiconductor film including a crystalline semiconductor film and an amorphous semiconductor film over the crystalline semiconductor film;
forming an etching mask over a first region of the stacked semiconductor film; and
performing a first etching and a second etching on a second region of the stacked semiconductor film to expose a part of the crystalline semiconductor film,
wherein the first etching is performed using a first gas including a $CF_4$ gas, and
wherein the second etching is performed using a second gas including an HBr gas, a $CF_4$ gas and an oxygen gas.

9. The method for manufacturing a semiconductor device, according to claim 8, wherein the second etching is performed with bias power which is greater than 0 W and less than or equal to 100 W.

10. The method for manufacturing a semiconductor device, according to claim 8, wherein a flow ratio of the HBr gas, the $CF_4$ gas, and the oxygen gas in the second etching is 24:1:1.

11. The method for manufacturing a semiconductor device, according to claim 8, wherein the crystalline semiconductor film is a microcrystalline semiconductor film.

12. The method for manufacturing a semiconductor device, according to claim 11,
wherein the microcrystalline semiconductor film is formed of microcrystalline silicon, and
wherein the amorphous semiconductor film is formed of amorphous silicon.

13. The method for manufacturing a semiconductor device, according to claim 8, wherein a concentration of oxygen and nitrogen included in the crystalline semiconductor film is lower than $1.0 \times 10^{18}$ atoms/cm$^3$.

14. The method for manufacturing a semiconductor device, according to claim 8, further comprising the step of performing an insulation treatment on a side surface of the stacked semiconductor film.

15. A method for manufacturing a semiconductor device, comprising the steps of:
   forming a first conductive layer over a substrate;
   forming a first insulating film over the first conductive layer;
   forming a crystalline semiconductor film over the first insulating film;
   forming an amorphous semiconductor film over the crystalline semiconductor film;
   forming an impurity semiconductor film over the amorphous semiconductor film;
   etching a portion of the crystalline semiconductor film, the amorphous semiconductor film and the impurity semiconductor film to form a thin film stack;
   forming a conductive film over the thin film stack;
   etching the conductive film to form a second conductive layer; and
   performing a first etching and a second etching on the thin film stack in a portion which does not overlap with the second conductive layer to expose the crystalline semiconductor film in the portion which does not overlap with the second conductive layer,
   wherein the first etching is performed using a first gas including a CF$_4$ gas, and
   wherein the second etching is performed using a second gas including an HBr gas, a CF$_4$ gas, and an oxygen gas.

16. The method for manufacturing a semiconductor device, according to claim 15, wherein the second etching is performed with bias power which is greater than 0 W and less than or equal to 100 W.

17. The method for manufacturing a semiconductor device, according to claim 15, wherein a flow ratio of the HBr gas, the CF$_4$ gas, and the oxygen gas in the second etching is 24:1:1.

18. The method for manufacturing a semiconductor device, according to claim 15, wherein the crystalline semiconductor film is a microcrystalline semiconductor film.

19. The method for manufacturing a semiconductor device, according to claim 18,
   wherein the microcrystalline semiconductor film is formed of microcrystalline silicon, and
   wherein the amorphous semiconductor film is formed of amorphous silicon.

20. The method for manufacturing a semiconductor device, according to claim 15, wherein a concentration of oxygen and nitrogen included in the crystalline semiconductor film is lower than $1.0 \times 10^{18}$ atoms/cm$^3$.

21. The method for manufacturing a semiconductor device according claim 15, further comprising the step of performing an insulation treatment on a side surface of the thin film stack.

22. A method for manufacturing a semiconductor device, comprising the steps of:
   forming a gate electrode over a substrate;
   forming a gate insulating film over the gate electrode;
   forming a crystalline semiconductor film over the gate insulating film;
   forming an amorphous semiconductor film over the crystalline semiconductor film;
   forming an impurity semiconductor film over the amorphous semiconductor film;
   forming a first etching mask over the impurity semiconductor film;
   etching a portion of the crystalline semiconductor film, the amorphous semiconductor film and the impurity semiconductor film which does not overlap with the first etching mask to form a thin film stack;
   removing the first etching mask;
   forming a conductive film over the thin film stack;
   forming a second etching mask over the conductive film;
   etching the conductive film to form a source electrode and a drain electrode;
   removing the second etching mask; and
   performing a first etching and a second etching on the thin film stack in a portion which does not overlap with the source electrode and the drain electrode to expose the crystalline semiconductor film in the portion which does not overlap with the source electrode and the drain electrode,
   wherein the first etching is performed using a first gas including a CF$_4$ gas, and
   wherein the second etching is performed using a second gas including an HBr gas, a CF$_4$ gas, and an oxygen gas.

23. The method for manufacturing a semiconductor device, according to claim 22, wherein the second etching is performed with bias power which is greater than 0 W and less than or equal to 100 W.

24. The method for manufacturing a semiconductor device, according to claim 22, wherein a flow ratio of the HBr gas, the CF$_4$ gas, and the oxygen gas in the second etching is 24:1:1.

25. The method for manufacturing a semiconductor device, according to claim 22, wherein the crystalline semiconductor film is a microcrystalline semiconductor film.

26. The method for manufacturing a semiconductor device, according to claim 25,
   wherein the microcrystalline semiconductor film is formed of microcrystalline silicon, and
   wherein the amorphous semiconductor film is formed of amorphous silicon.

27. The method for manufacturing a semiconductor device, according to claim 22, wherein a concentration of oxygen and nitrogen included in the crystalline semiconductor film is lower than $1.0 \times 10^{18}$ atoms/cm$^3$.

28. The method for manufacturing a semiconductor device according claim 22, further comprising the step of performing an insulation treatment on a side surface of the thin film stack.

29. A method for manufacturing a semiconductor device, comprising the steps of:
   forming a gate electrode over a substrate;
   forming a gate insulating film over the gate electrode;
   forming a crystalline semiconductor film over the gate insulating film;
   forming an amorphous semiconductor film over the crystalline semiconductor film;
   forming an impurity semiconductor film over the amorphous semiconductor film;
   forming a first etching mask over the impurity semiconductor film;
   etching a portion of the crystalline semiconductor film, the amorphous semiconductor film and the impurity semiconductor film which does not overlap with the first etching mask to form a thin film stack;
   removing the first etching mask;
   forming a conductive film over the thin film stack;
   forming a second etching mask over the conductive film;
   etching the conductive film to form a source electrode and a drain electrode;
   performing a first etching and a second etching on the thin film stack in a portion which does not overlap with the source electrode and the drain electrode to expose the crystalline semiconductor film in the portion which does not overlap with the source electrode and the drain electrode; and removing the second etching mask, wherein the first etching is performed using a first gas including a $CF_4$ gas, and wherein the second etching is performed using a second gas including an HBr gas, a $CF_4$ gas, and an oxygen gas.

30. The method for manufacturing a semiconductor device, according to claim 29, wherein the second etching is performed with bias power which is greater than 0 W and less than or equal to 100 W.

31. The method for manufacturing a semiconductor device, according to claim 29, wherein a flow ratio of the HBr gas, the $CF_4$ gas, and the oxygen gas in the second etching is 24:1:1.

32. The method for manufacturing a semiconductor device, according to claim 29, wherein the crystalline semiconductor film is a microcrystalline semiconductor film.

33. The method for manufacturing a semiconductor device, according to claim 32, wherein the microcrystalline semiconductor film is formed of microcrystalline silicon, and wherein the amorphous semiconductor film is formed of amorphous silicon.

34. The method for manufacturing a semiconductor device, according to claim 29, wherein a concentration of oxygen and nitrogen included in the crystalline semiconductor film is lower than $1.0 \times 10^{18}$ atoms/cm$^3$.

35. The method for manufacturing a semiconductor device according claim 29, further comprising the step of performing an insulation treatment on a side surface of the thin film stack.

* * * * *